United States Patent
Kim et al.

(10) Patent No.: US 10,332,798 B2
(45) Date of Patent: Jun. 25, 2019

(54) METHOD FOR DESIGNING LAYOUT OF SEMICONDUCTOR DEVICE AND METHOD FOR MANUFACTURING SEMICONDUCTOR DEVICE USING THE SAME

(71) Applicant: SAMSUNG ELECTRONICS CO., LTD., Suwon-si (KR)

(72) Inventors: Ha-Young Kim, Seoul (KR); JinTae Kim, Daejon (KR); Jae-Woo Seo, Seoul (KR); Dong-yeon Heo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 188 days.

(21) Appl. No.: 15/624,039

(22) Filed: Jun. 15, 2017

(65) Prior Publication Data
US 2017/0287787 A1    Oct. 5, 2017

Related U.S. Application Data

(62) Division of application No. 15/094,764, filed on Apr. 8, 2016, now Pat. No. 9,698,056.

(30) Foreign Application Priority Data

Apr. 9, 2015 (KR) .................. 10-2015-0050150
Sep. 9, 2015 (KR) .................. 10-2015-0127787

(51) Int. Cl.
*H01L 21/8238* (2006.01)
*H01L 27/06* (2006.01)
(Continued)

(52) U.S. Cl.
CPC .. *H01L 21/823475* (2013.01); *G06F 17/5072* (2013.01); *G06F 17/5081* (2013.01);
(Continued)

(58) Field of Classification Search
CPC .................. H01L 21/823475; G06F 17/5081
See application file for complete search history.

(56) References Cited

U.S. PATENT DOCUMENTS 6,054,872 A    4/2000   Fudanuki et al.
6,536,028 B1   3/2003   Katsioulas et al.
(Continued)

FOREIGN PATENT DOCUMENTS

JP    8-213466 A    8/1996
JP    9-185641 A    7/1997
(Continued)

OTHER PUBLICATIONS

"Physical Library Analysis for Optimal 28-nm and 20-nm Routing (Version 3.0)"; Synopsys Accelerating Innovation; Router CAE Jul. 15, 2013; 63 pgs. total.
(Continued)

*Primary Examiner* — Moazzam Hossain
(74) *Attorney, Agent, or Firm* — Sughrue Mion, PLLC

(57) ABSTRACT

A method of manufacturing a semiconductor device includes configuring a layout pattern; and forming conductive lines corresponding to the layout pattern on a substrate, wherein configuring the layout pattern includes: arranging pre-conductive patterns and post-conductive patterns for a first logic cell, a second logic cell, and a third logic cell; rearranging the pre-conductive patterns and the post-conductive patterns so that two conductive patterns that are adjacent to a boundary between two adjacent logic cells from among the first logic cell, the second logic cell, and the third logic cell are formed by different photolithography processes; and arranging conductive patterns for a dummy cell arranged between the second logic cell and the third logic cell.

6 Claims, 18 Drawing Sheets

(51) Int. Cl.
  *G06F 17/50* (2006.01)
  *H01L 21/8234* (2006.01)
  *H01L 21/768* (2006.01)
  *H01L 27/02* (2006.01)

(52) U.S. Cl.
  CPC .. *H01L 21/76816* (2013.01); *H01L 21/76892* (2013.01); *H01L 27/0207* (2013.01); *H01L 21/823871* (2013.01); *H01L 27/0629* (2013.01)

(56) References Cited

U.S. PATENT DOCUMENTS

| | | |
|---|---|---|
| 7,039,881 B2 | 5/2006 | Regan |
| 7,299,440 B2 | 11/2007 | Yoshida et al. |
| 7,302,660 B2 | 11/2007 | Shimamura |
| 7,321,139 B2 | 1/2008 | Chang et al. |
| 7,888,705 B2 | 2/2011 | Becker et al. |
| 7,919,792 B2 | 4/2011 | Law et al. |
| 7,989,849 B2 | 8/2011 | Sherlekar et al. |
| 8,063,414 B2 | 11/2011 | Uchida |
| 8,176,457 B2 | 5/2012 | Kato et al. |
| 8,220,696 B2 | 7/2012 | Kawada |
| 8,239,807 B2 | 8/2012 | Arora et al. |
| 8,255,837 B2 | 8/2012 | Lu et al. |
| 8,327,301 B2 | 12/2012 | Cheng et al. |
| 8,357,955 B2 | 1/2013 | Tanaka |
| 8,513,978 B2 | 8/2013 | Sherlekar |
| 8,584,052 B2 | 11/2013 | Chen et al. |
| 8,612,914 B2 | 12/2013 | Sherlekar et al. |
| 8,647,893 B1 | 2/2014 | Agarwal et al. |
| 8,661,392 B2 | 2/2014 | Quandt et al. |
| 8,729,606 B2 | 5/2014 | Becker et al. |
| 8,732,628 B1 | 5/2014 | Wu et al. |
| 8,739,095 B2 | 5/2014 | Cao et al. |
| 8,788,998 B2 | 7/2014 | Hatamian et al. |
| 8,863,063 B2 | 10/2014 | Becket et al. |
| 8,935,639 B1 | 1/2015 | Tzeng |
| 8,949,749 B2 | 2/2015 | Wang et al. |
| 8,959,472 B1* | 2/2015 | Frederick, Jr. ...... G06F 17/5077 716/122 |
| 9,007,060 B2 | 4/2015 | Ausserlechner |
| 9,098,670 B2 | 8/2015 | Song et al. |
| 2003/0084418 A1 | 5/2003 | Regan |
| 2005/0198604 A1 | 9/2005 | Yoshida et al. |
| 2006/0136848 A1* | 6/2006 | Ichiryu ............... G06F 17/5072 716/120 |
| 2006/0138464 A1 | 6/2006 | Shimamura |
| 2007/0234243 A1 | 10/2007 | Kyoh |
| 2007/0284618 A1 | 12/2007 | Chang et al. |
| 2007/0300202 A1 | 12/2007 | Uchida |
| 2008/0111158 A1 | 5/2008 | Sherlekar et al. |
| 2008/0223502 A1 | 9/2008 | Kawada |
| 2008/0263500 A1 | 10/2008 | Kato et al. |
| 2009/0032898 A1 | 2/2009 | Becker et al. |
| 2010/0115484 A1* | 5/2010 | Frederick ........... G06F 17/5072 716/119 |
| 2010/0155783 A1 | 6/2010 | Law et al. |
| 2010/0187626 A1 | 7/2010 | Becker |
| 2010/0196803 A1 | 8/2010 | Lu et al. |
| 2010/0199253 A1 | 8/2010 | Cheng et al. |
| 2011/0049575 A1 | 3/2011 | Tanaka |
| 2011/0084312 A1 | 4/2011 | Quandt et al. |
| 2011/0145775 A1 | 6/2011 | Sano |
| 2011/0219341 A1 | 9/2011 | Cao et al. |
| 2011/0296366 A1 | 12/2011 | Arora et al. |
| 2012/0167021 A1 | 6/2012 | Chen et al. |
| 2012/0241986 A1 | 9/2012 | Sherlekar et al. |
| 2012/0249182 A1 | 10/2012 | Sherlekar |
| 2013/0021026 A1 | 1/2013 | Ausserlechner |
| 2013/0086536 A1* | 4/2013 | Kim ................... G06F 17/5081 716/55 |
| 2013/0207199 A1 | 8/2013 | Becker et al. |
| 2013/0339911 A1* | 12/2013 | Hsu ........................ G06F 17/50 716/55 |
| 2014/0065728 A1 | 3/2014 | Agarwal et al. |
| 2014/0115546 A1 | 4/2014 | Wang et al. |
| 2014/0181774 A1 | 6/2014 | Hatamian et al. |
| 2014/0304671 A1 | 10/2014 | Lu et al. |
| 2014/0380256 A1 | 12/2014 | Song et al. |
| 2015/0095857 A1 | 4/2015 | Hsu et al. |
| 2016/0283634 A1 | 9/2016 | Kim et al. |

FOREIGN PATENT DOCUMENTS

| | | |
|---|---|---|
| JP | 11-3943 A | 1/1999 |
| JP | 2003-529210 A | 9/2003 |
| JP | 2004-165443 A | 6/2004 |
| JP | 2011-124423 A | 6/2011 |
| JP | 2012-28479 A | 2/2012 |
| JP | 5151313 B2 | 2/2013 |
| JP | 2013-73139 A | 4/2013 |
| JP | 2014-236116 A | 12/2014 |
| JP | 5758815 B2 | 8/2015 |
| KR | 10-0846089 B1 | 7/2008 |
| KR | 10-0935125 B1 | 1/2010 |
| KR | 10-2015-0035405 A | 4/2015 |
| KR | 10-1532858 B1 | 6/2015 |

OTHER PUBLICATIONS

Communication from United States Patent and Trademark Office dated Feb. 10, 2017 in U.S. Appl. No. 15/094,586.

* cited by examiner

METHOD FOR DESIGNING LAYOUT OF SEMICONDUCTOR DEVICE AND METHOD FOR MANUFACTURING SEMICONDUCTOR DEVICE USING THE SAME

CROSS-REFERENCE TO RELATED APPLICATION(S)

This application is a Divisional Application of U.S. application Ser. No. 15/094,764 filed Apr. 8, 2016, which claims priority under 35 U.S.C. § 119 from Korean Patent Application Nos. 10-2015-0050150 filed Apr. 9, 2015, and 10-2015-0127787 filed Sep. 9, 2015, in the Korean Intellectual Property Office, the entire contents of which are hereby incorporated by reference.

BACKGROUND

1. Field

Apparatuses and methods consistent with exemplary embodiments relate to a layout design method of a semiconductor device, and more particularly, relate to a layout design method of a semiconductor device including field effect transistors and a method of manufacturing a semiconductor device using the same.

2. Related Art

To increase the capacity of a semiconductor device and to reduce a manufacturing cost, there are many efforts to increase the degree of integration of a semiconductor device because the degree of integration is an important factor for determining a product price. Because the degree of integration is determined according to an area which a unit cell occupies, it is important to effectively design a layout of a semiconductor device. Generally, designing a layout of a semiconductor device using a layout design tool requires significant time, and trial and error. Therefore, it is important to shorten a layout design time.

SUMMARY

According to an aspect of an exemplary embodiment, there is provided a method of reducing a layout design time, which increases according to the insertion of a dummy cell, at a layout design of a semiconductor device.

According to an aspect of an exemplary embodiment, a method of manufacturing a semiconductor device is provided. The method may include providing pre-conductive lines and post-conductive lines for forming a first logic cell, a second logic cell, a dummy cell, and a third logic cell, the first logic cell and the second logic cell being adjacent to each other and the dummy cell and the third logic cell being adjacent to each other. A first conductive line, which is adjacent to the second logic cell, from among conductive lines of the first logic cell may be spaced a first reference distance apart from a second conductive line, which is adjacent to the first logic cell, from among conductive lines of the second logic cell. A dummy line, which is adjacent to the third logic cell, from among conductive lines of the dummy cell is spaced a second reference distance apart from a third conductive line, which is adjacent to the dummy cell, from among conductive lines of the third logic cell. The second reference distance is greater than the first reference distance.

The first reference distance and the second reference distance may be set based on a resolution of a photolithography process for forming the pre-conductive lines and the post-conductive lines.

The first conductive line and the second conductive line may be formed by a patterning process using different photomasks, and the dummy line and the third conductive line may be formed by a patterning process using a same photomask. A fourth conductive line, which is adjacent to the dummy cell, from among conductive lines of the second logic cell and the third conductive line may be formed by a patterning process using different photomasks.

At least a portion of the first conductive line, the second conductive line, the third conductive line, and the dummy line may be arranged in a first direction perpendicular to a direction in which the first logic cell, the second logic cell, the third logic cell, and the dummy cell may be arranged. The method may further include providing first power lines and second power lines arranged in a second direction perpendicular to the first direction before providing the pre-conductive lines and the post-conductive lines. A ground voltage may be provided to one of the first power lines and the second power lines.

The dummy cell may be one of filler, a filling capacitor, and a spare cell.

The method may further include before forming the pre-conductive lines and the post-conductive lines, forming an active pattern on a substrate, forming a gate pattern crossing the active pattern, and forming a source area and a drain area on the active pattern located at opposite sides of the gate pattern. At least one of the pre-conductive lines may be electrically connected to the gate pattern and at least one of the post-conductive lines may be electrically connected to the gate pattern, and another line of the pre-conductive lines may be electrically connected to the source area and the drain area and at least another line of the post-conductive lines may be electrically connected to the source area and the drain area.

According to an aspect of an exemplary embodiment, a method of manufacturing a semiconductor device is provided. The method may include forming a layout pattern, and configuring conductive lines corresponding to the layout pattern on a substrate. Configuring the layout pattern may include arranging pre-conductive patterns and post-conductive patterns for a first logic cell, a second logic cell, and a third logic cell, rearranging the pre-conductive patterns and the post-conductive patterns so that two conductive patterns that are adjacent to a boundary between two adjacent logic cells from among the first logic cell, the second logic cell, and the third logic cell are formed by different photolithography processes, and arranging conductive patterns for a dummy cell arranged between the second logic cell and the third logic cell. A first conductive pattern, which is adjacent to the second logic cell, from among conductive patterns of the first logic cell may be spaced a first reference distance apart from a second conductive pattern, which is adjacent to the first logic cell, from among conductive patterns of the second logic cell, and a dummy pattern, which is adjacent to the third logic cell, from among conductive patterns of the dummy cell may be spaced a second reference distance apart from a third conductive pattern, which is adjacent to the dummy cell, from among conductive patterns of the third logic cell. The second reference distance is greater than the first reference distance.

The first reference distance and the second reference distance may be set based on a resolution of a photolithography process for forming the pre-conductive patterns and the post-conductive patterns.

The first conductive pattern and the second conductive pattern may be formed by a patterning process using different photomasks, and the dummy line and the third conductive pattern may be formed by a patterning process using the same photomask.

A fourth conductive pattern, which is adjacent to the dummy cell, from among conductive patterns of the second logic cell and the third conductive pattern may be formed by a patterning process using different photomasks.

At least two of the first conductive pattern, the second conductive pattern, the third conductive pattern, and the dummy pattern may be arranged in a first direction perpendicular to a direction in which the first logic cell, the second logic cell, the third logic cell, and the dummy cell are arranged.

The dummy cell may be one of filler, a filling capacitor, and a spare cell.

According to an aspect of an exemplary embodiment, a method of manufacturing a semiconductor device is provided. The method includes: providing a first conductive line, which is adjacent to a second logic cell, from among conductive lines of a first logic cell, the first conductive line being spaced a first reference distance apart from a second conductive line, which is adjacent to the first logic cell, from among conductive lines of the second logic cell; and providing a dummy line, which is adjacent to a third logic cell, from among conductive lines of a dummy cell, the dummy line being spaced a second reference distance apart from a third conductive line, which is adjacent to the dummy cell, from among conductive lines of the third logic cell. The second reference distance is greater than the first reference distance.

The first reference distance and the second reference distance may be set based on a resolution of a photolithography process for forming pre-conductive lines and post-conductive lines.

The first conductive line and the second conductive line may be formed by a patterning process using different photomasks, and the dummy line and the third conductive line may be formed by a patterning process using a same photomask.

The dummy cell may be one from among a filler, a filling capacitor, and a spare cell.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
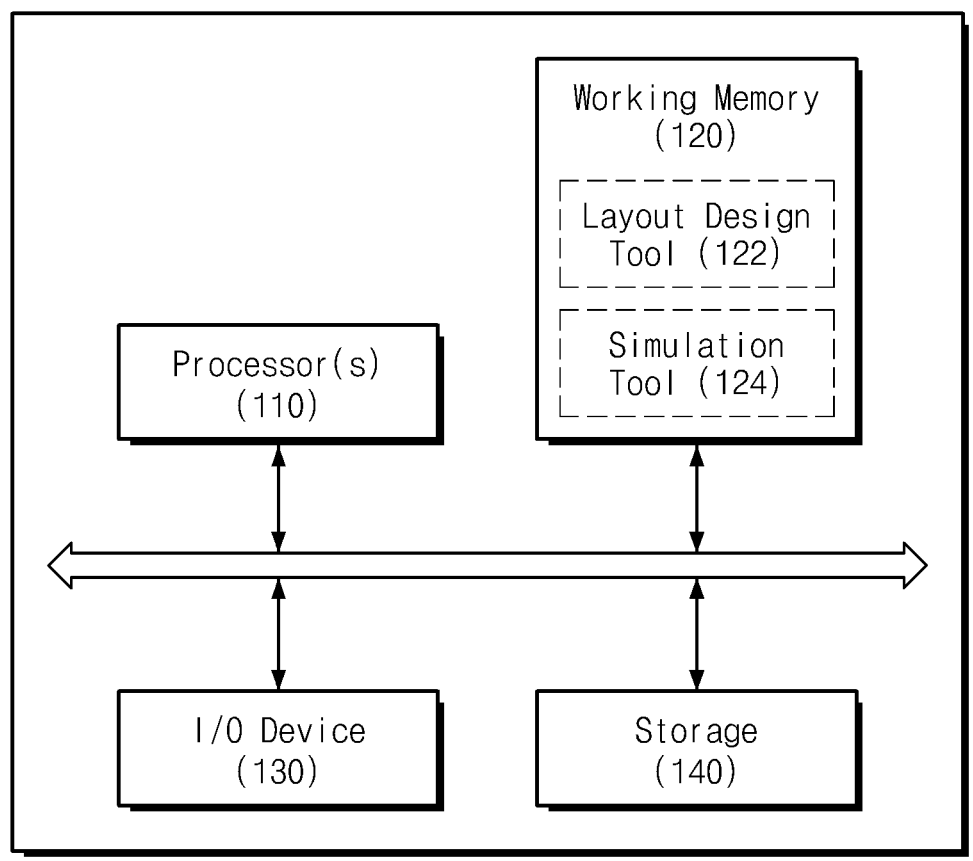
FIG. 1 is a block diagram illustrating a computing system for designing a semiconductor device according to an exemplary embodiment.

It is to be understood that both the foregoing general description and the following detailed description are provided as examples, for illustration and not for limiting the scope of the inventive concept. Reference will now be made in detail to the exemplary embodiments, which are illustrated in the accompanying drawings. Wherever possible, the same reference numbers are used in the drawings and the description to refer to the same or like parts.

It will be understood that when an element is referred to as being "connected," or "coupled," to another element or layer, it can be directly connected or coupled to the other element or intervening elements may be present. In contrast, when an element is referred to as being "directly connected," or "directly coupled," to another element, there are no intervening elements present. As used herein, the term "and/or," includes any and all combinations of one or more of the associated listed items.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features.

The terminology used herein is for the purpose of describing particular exemplary embodiments only and is not intended to be limiting of exemplary embodiments. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising,"

"includes," and/or "including," when used herein, specify the presence of stated features, integers, steps, operations, elements, and/or components, but do not preclude the presence or addition of one or more other features, integers, steps, operations, elements, components, and/or groups thereof.

Below, exemplary embodiments will be described with reference to accompanying drawings in order to describe the exemplary embodiments in detail to the extent that one skilled in the art can easily implement the scope and spirit of the inventive concept.

FIG. 1 is a block diagram illustrating a computing system for designing a semiconductor device, according to an exemplary embodiment. Referring to FIG. 1, a computing system 100 may include at least one processor 110, a working memory 120, an input/output device 130, and a storage device 140. Here, the computing system 100 may be provided as a dedicated device for designing a layout according to an exemplary embodiment. Moreover, the computing system 100 may be configured to drive various design and verification simulation programs.

The processor 110 may execute software (e.g., application program, operating system (OS), device drivers, etc.) to be executed in the computing system 100. The processor 110 may execute an OS (not shown) loaded in the working memory 120. The processor 110 may execute various application programs to be driven based on an operating system. For example, the processor 110 may execute a layout design tool 122 loaded in the working memory 120.

An OS or application programs may be loaded in the working memory 120. When the computing system 100 is booted up, an OS image (not shown) may be loaded onto the working memory 120 based on a booting sequence. An overall input/output operation of the computing system 100 may be supported by an OS. Likewise, application programs which are selected by a user to provide a basic service may be loaded in the working memory 120. Moreover, the layout design tool 122 for a layout design according to an exemplary embodiment may be also loaded from the storage device 140 to the working memory 120.

The layout design tool 122 may include a biasing function for changing a form and a position of a specific layout pattern different from a form and a position defined by a design rule. Moreover, the layout design tool 122 may perform a design rule check (DRC) in the changed biasing data condition. The working memory 120 may include a volatile memory such as a static random access memory (SRAM) or a dynamic random access memory (DRAM). However, the working memory 120 may include, but is not limited to, a nonvolatile memory such as a phase change random access memory (PRAM), a magnetoresistive random-access memory (MRAM), a resistance random access memory (ReRAM), a ferroelectric random access memory (FRAM), a flash memory.

The simulation tool 124 for performing an optical proximity correction (OPC) about designed layout data may be further loaded in the working memory 120.

The input/output device 130 may include various devices, which are capable of receiving information from a designer or providing information to a designer, such as a keyboard, a mouse, and a monitor. For example, a processing procedure and a processing result, or the like of the simulation tool 124 may be displayed through the input/output device 130.

The storage device 140 may be a storage medium of the computing system 100. The storage device 140 may store an application program, an OS image, and various kinds of data. For example, the storage device 140 may be a solid state drive (SSD), an embedded multimedia card (eMMC), or a hard disk drive (HDD). The storage device 140 may include a NAND Flash memory. Alternatively, the storage device 140 may include, but is not limited to, a nonvolatile memories such as a PRAM, a MRAM, a ReRAM, and a FRAM or a NOR flash memory.

Figure 2:
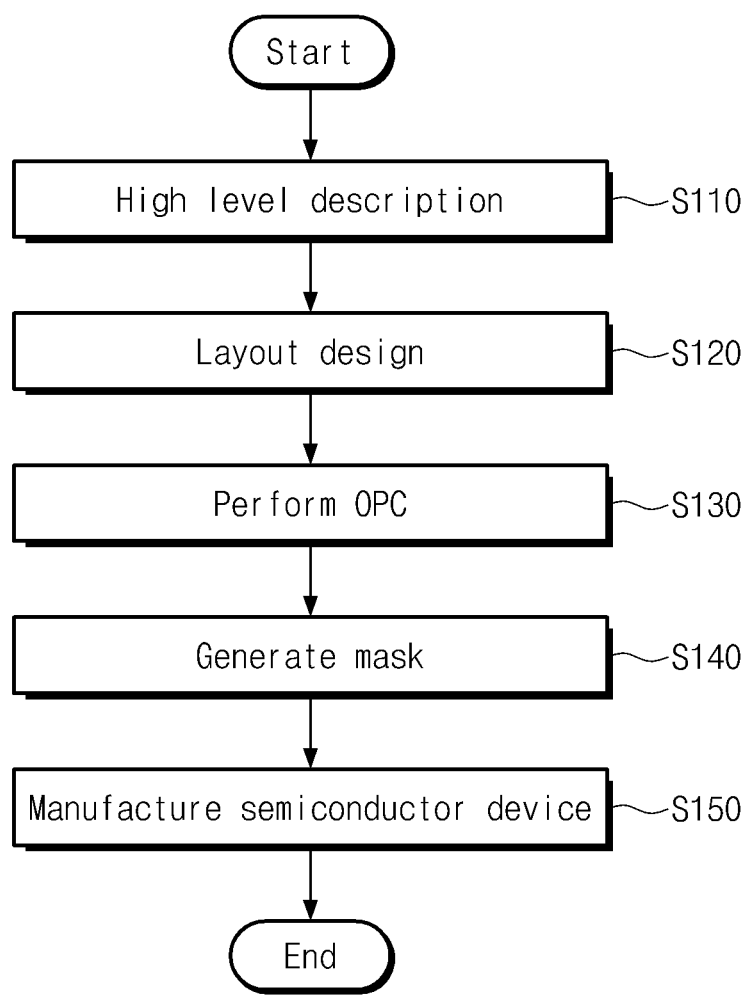
FIG. 2 is flowchart illustrating a method for designing and manufacturing a semiconductor device according to an exemplary embodiment.

FIG. 2 is flowchart illustrating a method for designing and manufacturing a semiconductor device according to an exemplary embodiment.

In operation S110, a high level design about a semiconductor integrated circuit may be performed using the computing system 100 illustrated in FIG. 1. The high level design may mean describing an integrated circuit, which is a design target, with a high-level language of a hardware description language (HDL). For example, a high-level language such as C language may be used. Circuits designed using the high level design may be specifically expressed using a register transfer level (RTL) coding and may be verified using a RTL simulation. Furthermore, a code generated by the RTL coding may be changed into a netlist, and the netlist may be synthesized into a semiconductor device of a top level. The synthesized schematic circuit may be verified by the simulation tool 124, and an adjustment process may be performed based on a verification result.

In operation S120, a layout design for implementing a semiconductor integrated circuit, which is logically completed, on a silicon substrate may be performed. For example, the layout design may be performed based on a schematic circuit or a netlist corresponding thereto, which is synthesized in a high level design. The layout design may include a routing process for placing and connecting various standard cells provided from a cell library based on a prescribed design rule. In a layout design according to an exemplary embodiment, to overcome a limitation of a resolution of a photolithography process, rearranging conductive patterns adjacent to a boundary between adjacent logic cells may be provided thereto. Moreover, arranging conductive patterns for forming dummy cells between logic cells may be provided after the rearranging of the conductive patterns. This will be described later in detail.

A cell library for expressing a circuit of a specific gate-level as a layout may be defined in a layout design tool. The layout may be a procedure for defining a form or a size of a pattern for forming a transistor and conductive lines formed on a silicon substrate. For example, to actually form an inverter circuit on a silicon substrate, layout patterns such as a p-channel metal oxide semiconductor (PMOS), an n-channel metal oxide semiconductor (NMOS), N-WELL, a gate electrode, and conductive lines arranged thereon may be properly arranged. To this end, firstly, a proper one of inverters already defined in a cell library may be retrieved and selected. Moreover, a routing of selected and arranged standard cells may be performed. The above-described processes may be automatically or manually performed by the layout design tool.

After routing, a layout may be verified to determine whether there is a portion violating a design rule. As an example of a verification operation, there may be a design rule check (DRC) for verifying whether a layout is properly set to fit a design rule, an electrical rule check (ERC) for verifying whether a layout is properly connected to each other without an electrical disconnection, a layout vs schematic (LVS) for recognizing whether a layout corresponds to a gate-level netlist.

In operation S130, an optical proximity correction (OPC) may be performed. Layout patterns obtained through a layout design may be implemented on a silicon substrate using a photolithography process. Here, the OPC may be a technology for correcting a distortion phenomenon generated in a photolithography process. That is, the distortion phenomenon such as refraction generated due to a characteristic of a light during an exposure using a pattern, in which a layout was performed, or a process effect may be corrected through the OPC. When the OPC is performed, a form and a position of designed layout patterns may be finely adjusted.

In operation S140, the photomasks may be manufactured based on a layout changed by the OPC. Generally, the photomask may be manufactured using a chrome thin film coated on a glass substrate with a method of depicting layer patterns.

In operation S150, a semiconductor device may be manufactured using the manufactured photomask. In a manufacture process of a semiconductor device using the photomask, various types of exposure and etch processes may be repeated. Through such processes, patterns formed in a layout design may be sequentially formed on a silicon substrate.

Figure 3:
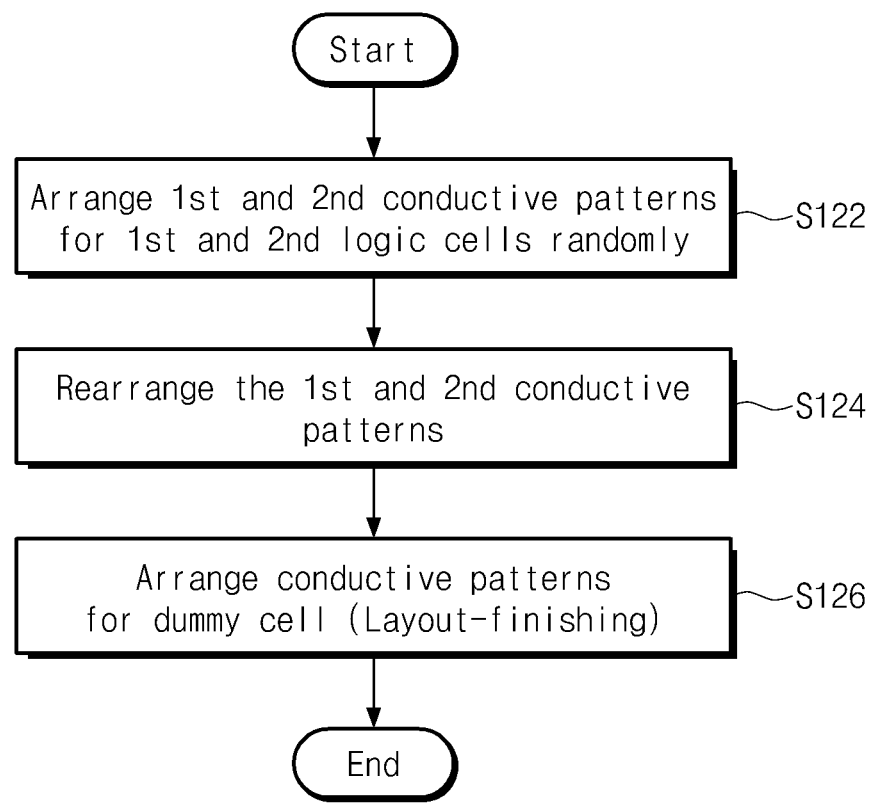
FIG. 3 is a flowchart illustrating operation S120 illustrated in FIG. 2.
Figure 4:
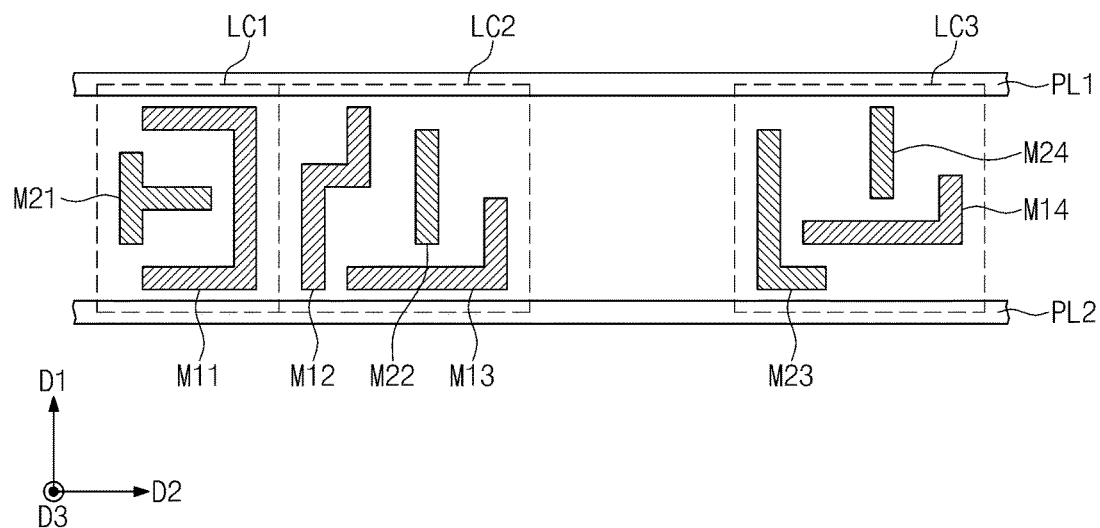
FIGS. 4 to 6 are diagrams illustrating layout patterns for describing a layout design method according to an exemplary embodiment.
Figure 5:
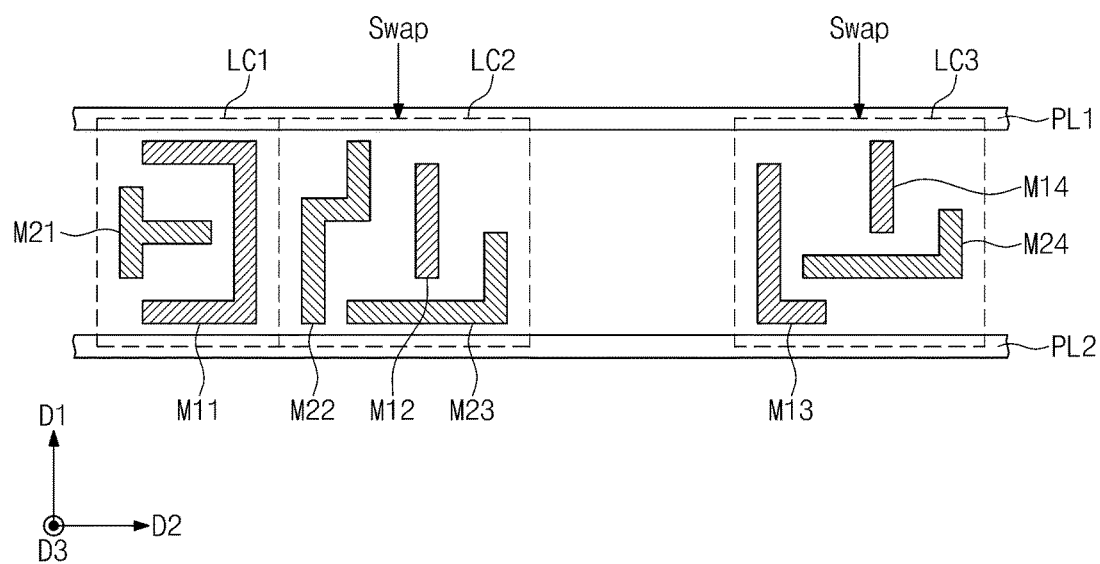
Figure 6:
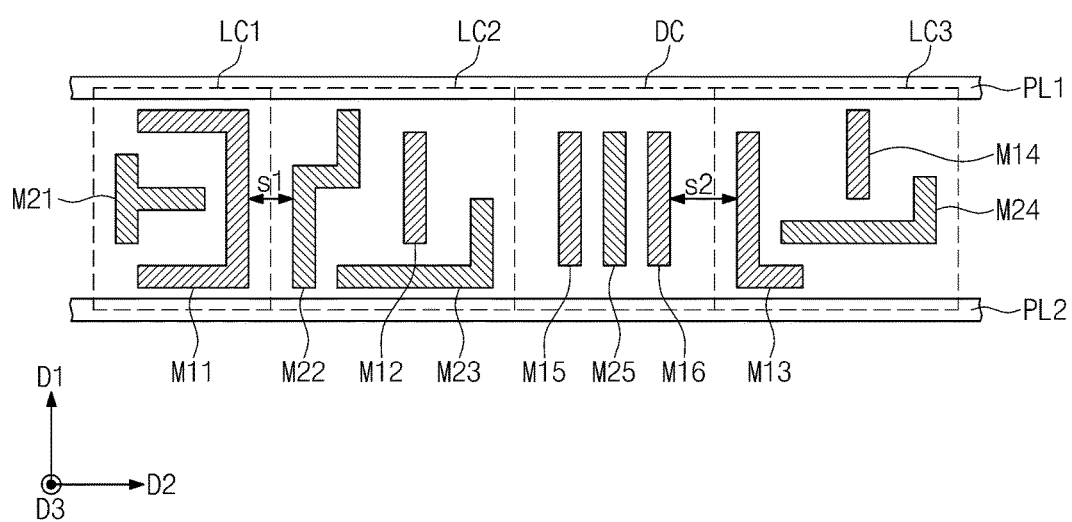
Figure 7A:
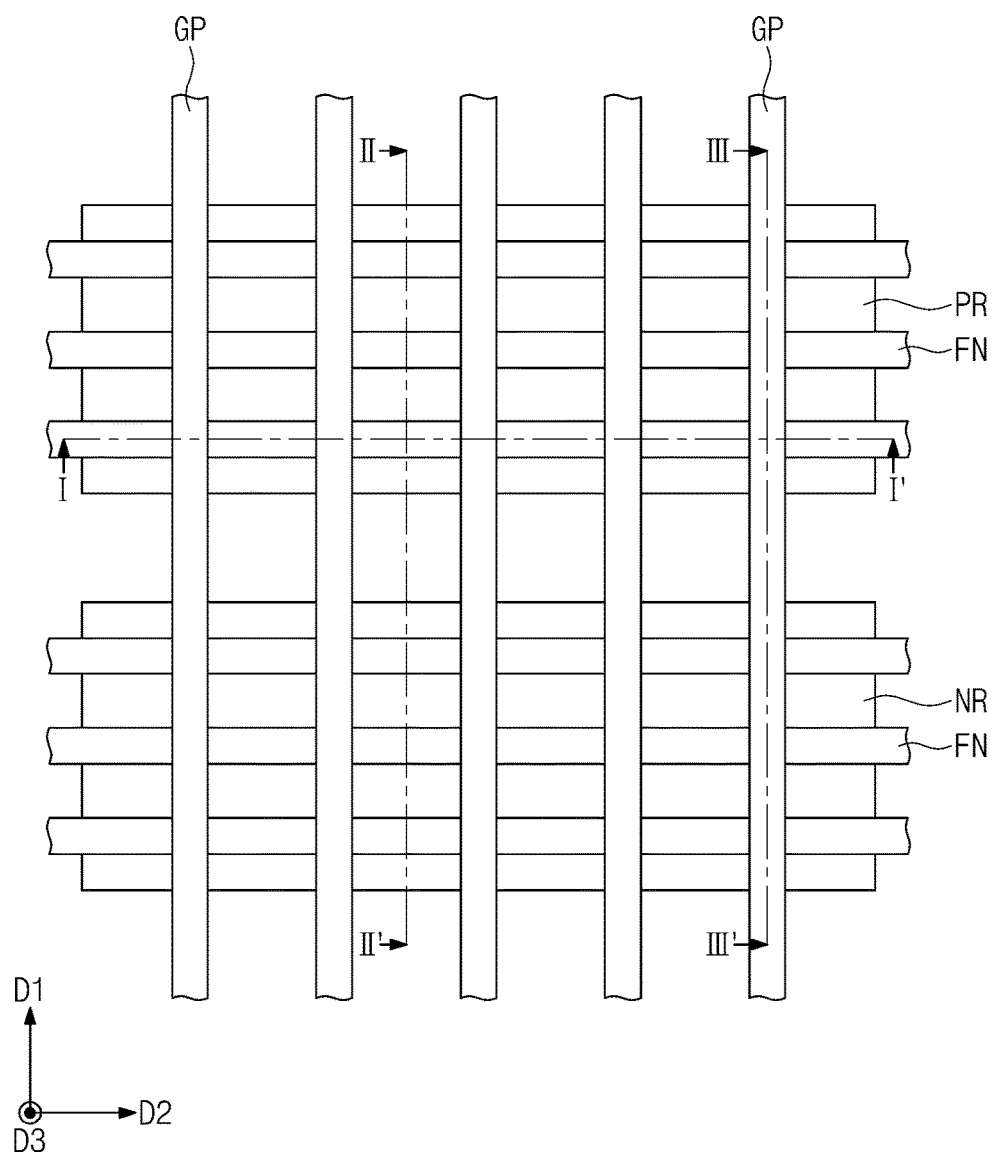
FIGS. 7A, 8A, 9A and 10A are plan views illustrating a manufacture process of a semiconductor device according to an exemplary embodiment.
Figure 7B:
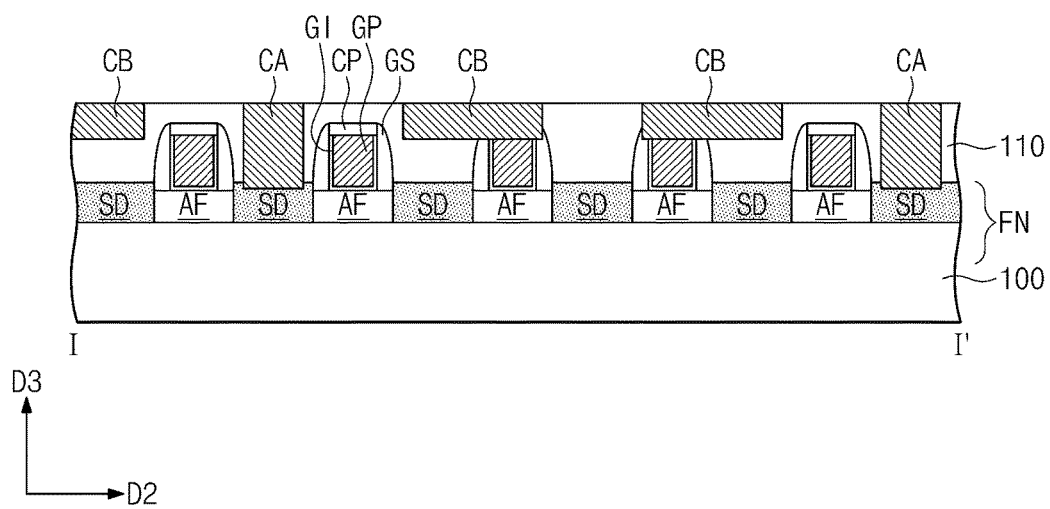
FIGS. 7B, 8B, 9B and 10B are cross-sectional views taken along lines I-I' of FIGS. 7A, 8A, 9A and 10A, respectively.
Figure 7C:
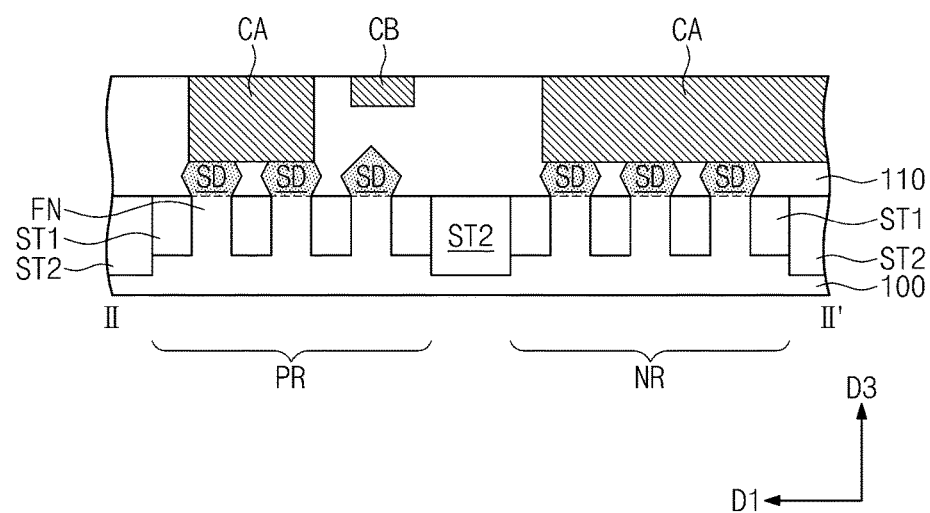
FIGS. 7C, 8C, 9C and 10C are cross-sectional views taken along lines II-II' of FIGS. 7A, 8A, 9A and 10A, respectively.
Figure 7D:
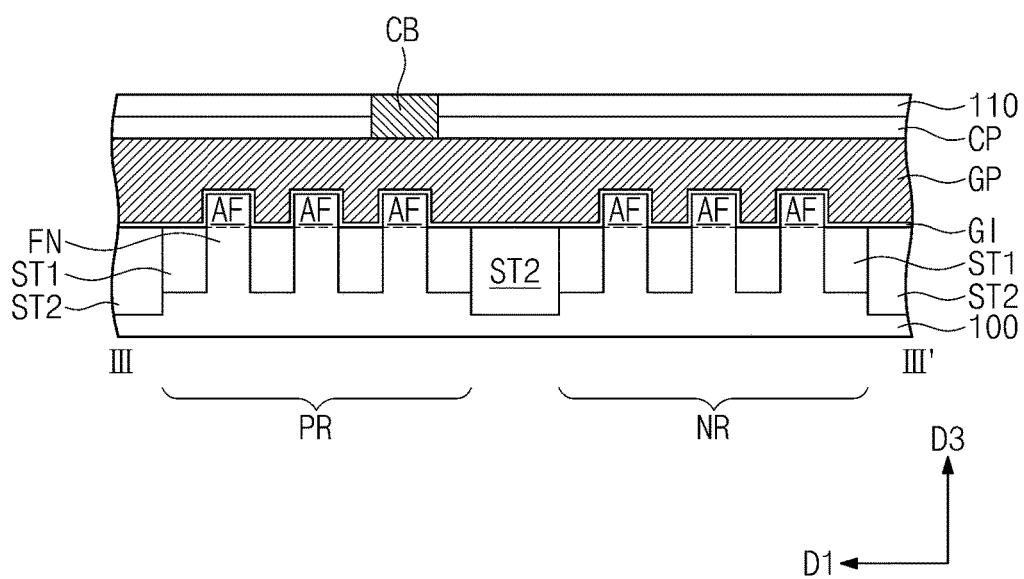
FIGS. 7D, 8D, 9D and 10D are cross-sectional views taken along III-III' of FIGS. 7A, 8A, 9A and 10A, respectively.
Figure 8A:
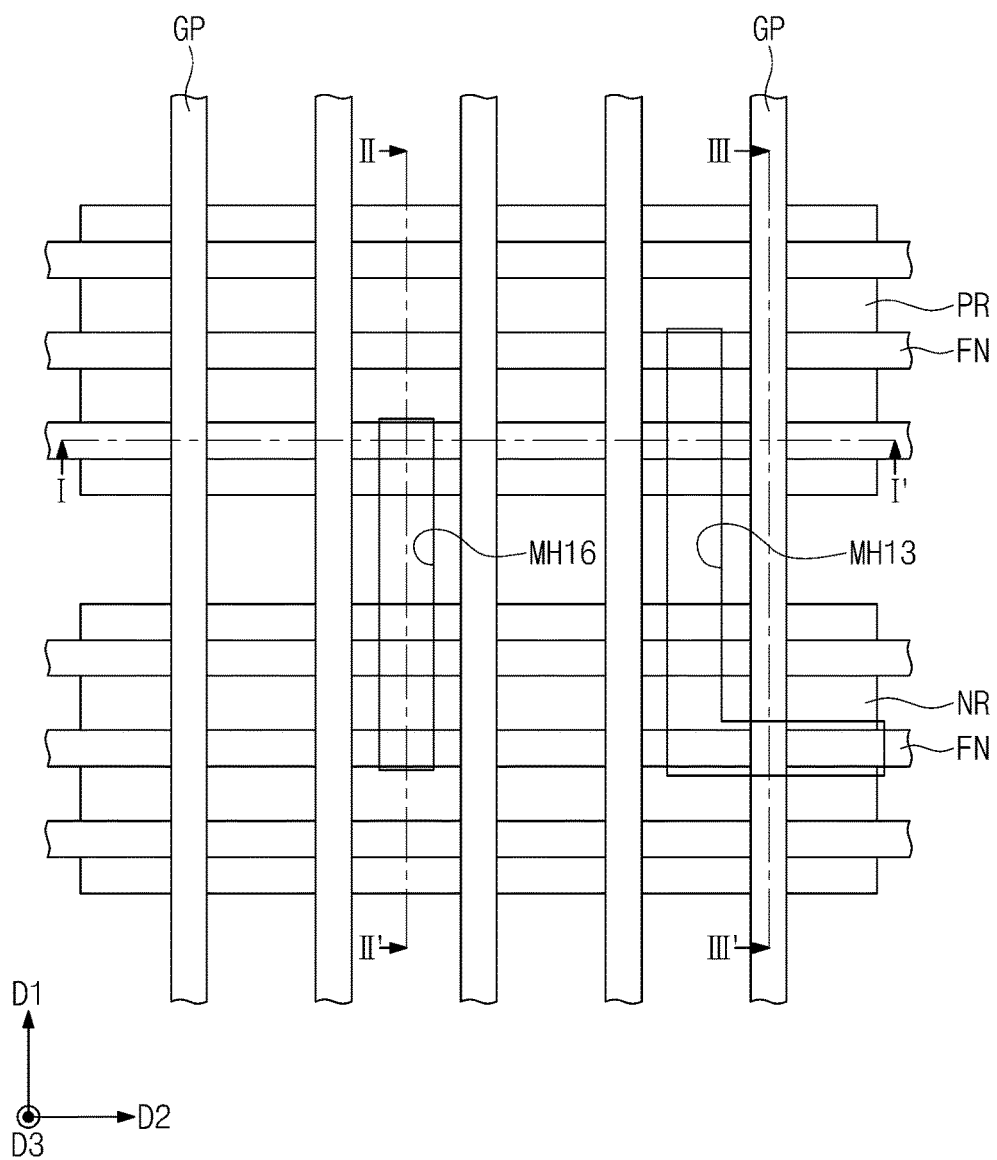
Figure 8B:
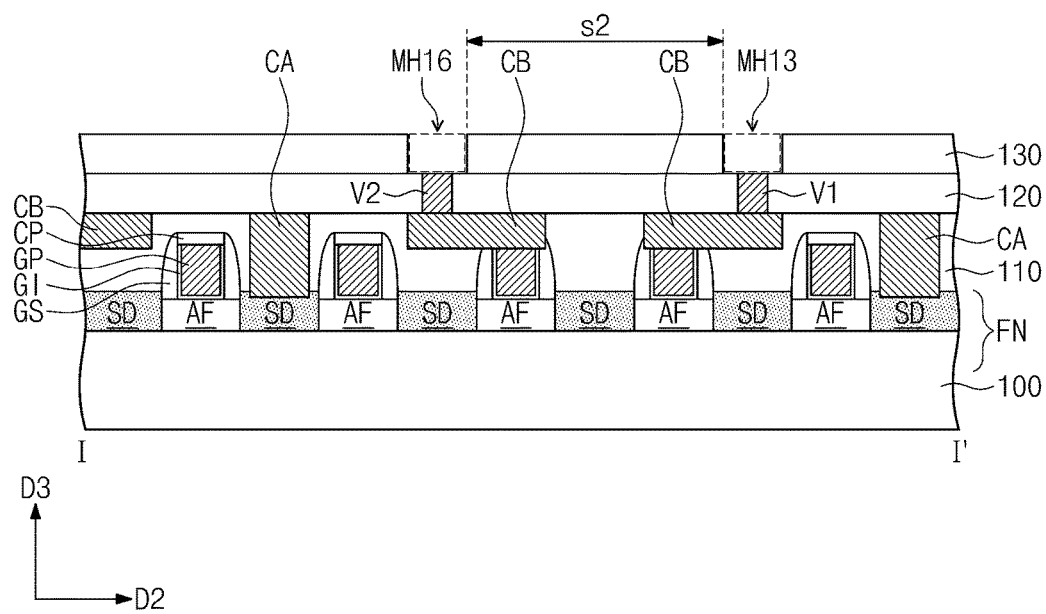
Figure 8C:
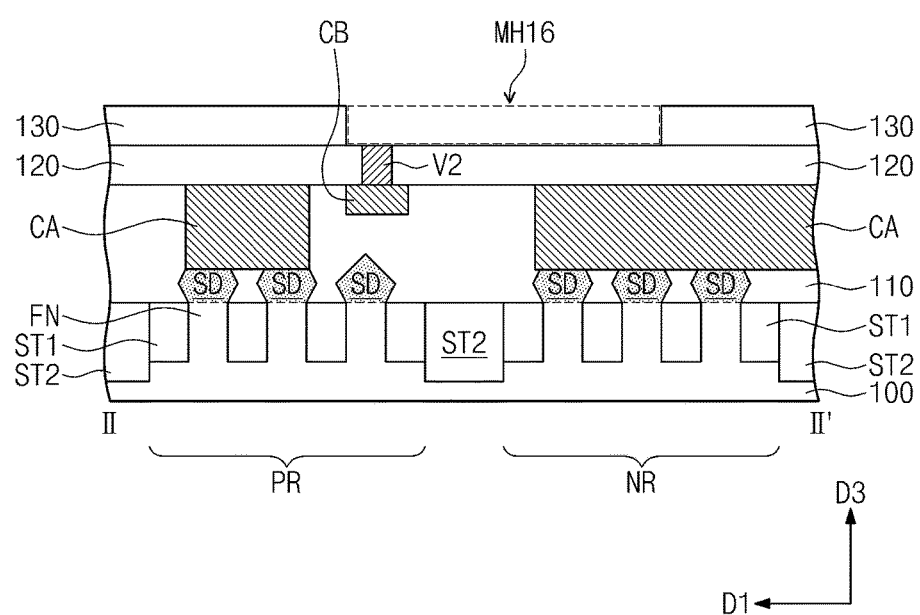
Figure 8D:
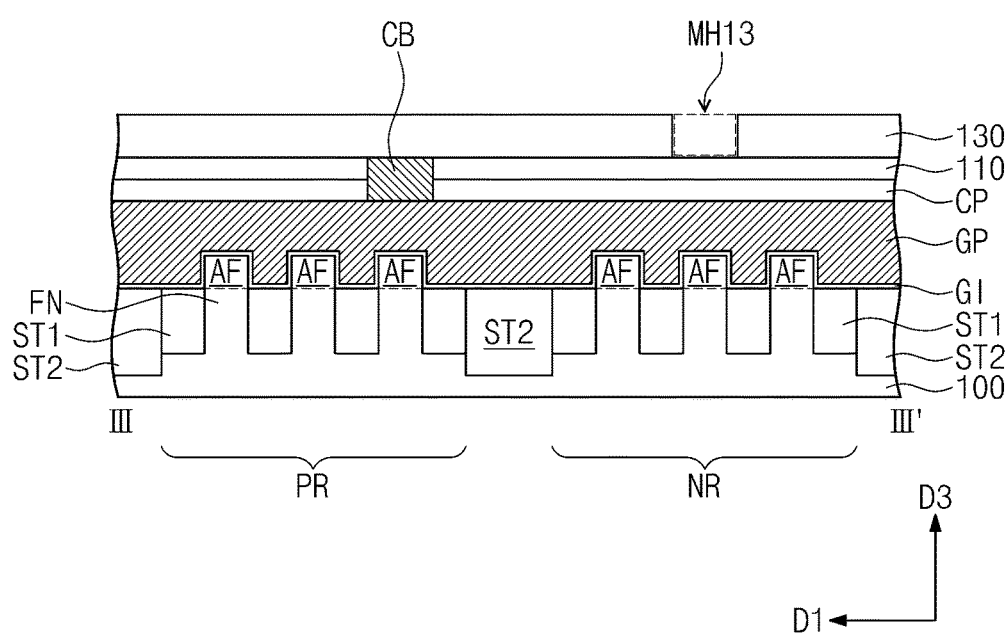

FIG. 3 is a flowchart illustrating operation 5120 illustrated in FIG. 2. FIGS. 4 to 6 are diagrams illustrating layout patterns for describing a layout design method according to an exemplary embodiment. FIGS. 4 to 6 illustrate a swapping process for determining sets of conductive lines to be formed by the same photolithography process.

Below, in terms defined herein, "conductive pattern" may mean a "virtual conductive line" generated by a layout design tool, and "conductive line" may mean a "real conductive line" formed by a photolithography process using the conductive pattern.

Referring to FIGS. 3 and 4, in operation 5122, conductive patterns for forming a first logic cell LC1, a second logic cell LC2, and a third logic cell LC3 may be randomly arranged. Conductive patterns generated by the layout design tool may be an original layout. For example, forming the original layout may include arranging lower/upper conductive patterns and via patterns. In detail, the conductive patterns may include pre-conductive patterns and post-conductive patterns.

The pre-conductive patterns may include conductive patterns M11, M12, M13, and M14, and the post-conductive patterns may include conductive patterns M21, M22, M23, and M24. Moreover, before the pre-conductive patterns M11, M12, M13, and M14 and the post-conductive patterns M21, M22, M23, and M24 are arranged, power lines PL1 and PL2 may be arranged. For example, a power voltage may be provided to the first power line PL1, and a ground voltage may be provided to the second power line PL2.

The pre-conductive patterns M11, M12, M13, and M14 and the post-conductive patterns M21, M22, M23, and M24 may include a line extending in a first direction D1 and/or a second direction D2. A photolithography process forming the pre-conductive patterns M11, M12, M13, and M14 may be different from a photolithography process forming the post-conductive patterns M21, M22, M23, and M24. For example, the pre-conductive patterns M11, M12, M13, and M14 may be formed by a first photolithography process. After the first photolithography process is performed, the post-conductive patterns M21, M22, M23, and M24 may be formed by a second photolithography process. In FIG. 4, conductive patterns formed by the same photolithography process are shown as using the same hatching line. For example, the pre-conductive patterns to be formed by the first photolithography process are illustrated using hatching lines inclined to the left, and the post-conductive patterns to be formed by the second photolithography process are illustrated using hatching lines inclined to the right.

However, the conductive patterns of the original layout generated by the layout design tool may be arbitrarily arranged without consideration of a resolution of a photolithography process for forming real conductive lines. For example, in the original layout, the conductive pattern M11 and the conductive pattern M12 may be formed by the first photolithography process, but because a distance between the conductive pattern M11 and the conductive pattern M12 is very short, it is impossible to form once a semiconductor integrated circuit by the first photolithography process due to a characteristic of a manufacturing process. To solve the problem, the swapping operation may be performed by the layout design tool.

Referring to FIGS. 3, 4 and 5, in operation S124, an operation for rearranging the pre-conductive patterns and the post-conductive patterns may be performed. This may be performed to address the problems about the above-described resolution of a photolithography process.

For example, the pre-conductive patterns and the post-conductive patterns may be rearranged such that conductive patterns, which are adjacent to a boundary between two logic cells adjacent to each other, are formed by different photolithography processes from each other. When there is exemplified the conductive patterns M22, M12, and M23 constituting the second logic cell LC2, the conductive patterns M12 may be arranged to be formed by the first photolithography process, and the conductive patterns M22 and M23 may be arranged to be formed by the second photolithography process Likewise, referring to conductive patterns M13, M14, and M24 constituting the third logic cell LC3, the conductive patterns M13 and M14 may be rearranged to be formed by the first photolithography process, and the conductive patterns M24 may be rearranged to be formed by the second photolithography process.

As a result, conductive patterns which are adjacent to a boundary between two logic cells adjacent to each other may be formed by different photolithography processes from each other, thereby resolving a problem generated by a resolution of a photolithography process. For example, a photolithography processes for forming the conductive pattern M11 may be different from a photolithography processes for forming the conductive pattern M22.

Referring to FIGS. 3, 4 and 6, in operation S126, conductive patterns M15, M16, and M25 constituting a dummy cell may be arranged. For example, the dummy cell may include at least one of a filler, a filling capacitor, or a spare cell. The filler may fill an empty space generated in a process for designing a layout. The filling capacitor may be provided between the power lines PL1 and PL2 for a stable power supply. The spare cell may be a cell for preparing an additional design, after a layout design is completed.

According to an exemplary embodiment, an additional swapping operation due to insertion of a dummy cell between logic cells may not be performed. That is, two conductive patterns adjacent to a boundary between a logic cell and a dummy cell may be formed by the same photolithography process. For example, in FIG. 6, the conductive pattern M16 and the conductive pattern M13 may be formed by the same photolithography process. Because an additional swapping operation about conductive patterns based on insertion of a dummy cell DC is omitted, a layout design time may be reduced. In a general layout design process, conductive patterns of the third logic cell LC3 may be rearranged due to insertion of the dummy cell DC. That is, an additional swapping operation may be performed such that a photolithography process for forming the conductive pattern M16 may be different from a photolithography process for forming the conductive pattern M13.

However, according to an exemplary embodiment, the conductive patterns of an inserted dummy cell may be spaced apart from conductive patterns of a logic cell, which is adjacent to the dummy cell, by a reference distance or more, instead of performing an additional swapping operation due to insertion of the dummy cell. In an exemplary embodiment, it is assumed that the dummy cell DC having the conductive patterns M15, M16, and M25 illustrated in FIG. 6 is provided between the second logic cell LC2 and the third logic cell LC3.

Firstly, the conductive patterns M23 and M13, which are adjacent to the dummy cell DC, from among the conductive patterns of the second and third logic cells LC2 and LC3 adjacent to each other with the dummy cell interposed therebetween may be rearranged to be formed by different photolithography processes based on a swapping operation which is performed before the dummy cell DC is inserted. Moreover, the dummy pattern M16, which is adjacent to the third logic cell LC3, from among the conductive patterns of the dummy cell DC may be spaced apart from the conductive patterns M13 by a reference distance s2 or more. For example, the reference distance s2 may be determined in consideration of a resolution of a photolithography process. Moreover, the reference distance s2 may be greater than a distance s1 between the conductive patterns (e.g., M11 and M22) adjacent to a boundary between two logic cells (e.g., LC1 and LC2) adjacent to each other.

However, it may not be required that the dummy pattern M15 is spaced apart from the conductive pattern M23 by the reference distance s2 or more, because a photolithography process for forming the conductive pattern M15 may be different from a photolithography process for forming the conductive pattern M23. When a layout is designed such that the dummy pattern M15 is formed by the same photolithography process as the conductive pattern M23, the dummy pattern M15 and the conductive pattern M23 may be arranged to be spaced apart by the reference distance s2 or more.

As described above, an exemplary embodiment is exemplified as after the pre-conductive patterns and the post-conductive patterns are randomly arranged in a layout design, a swapping operation about conductive patterns of logic cells is performed. However, according to an exemplary embodiment, when logic cells are arranged, conductive patterns adjacent to a boundary between logic cells may be arranged to be formed by different photolithography processes from each other, and a swapping operation may not be performed.

As described above, exemplary embodiments may omit an additional swapping operation based on insertion of a dummy cell but may arrange dummy patterns of the dummy cell in consideration of a resolution of a photolithography process, thereby making it possible to reduce a layout design time.

Figure 9A:
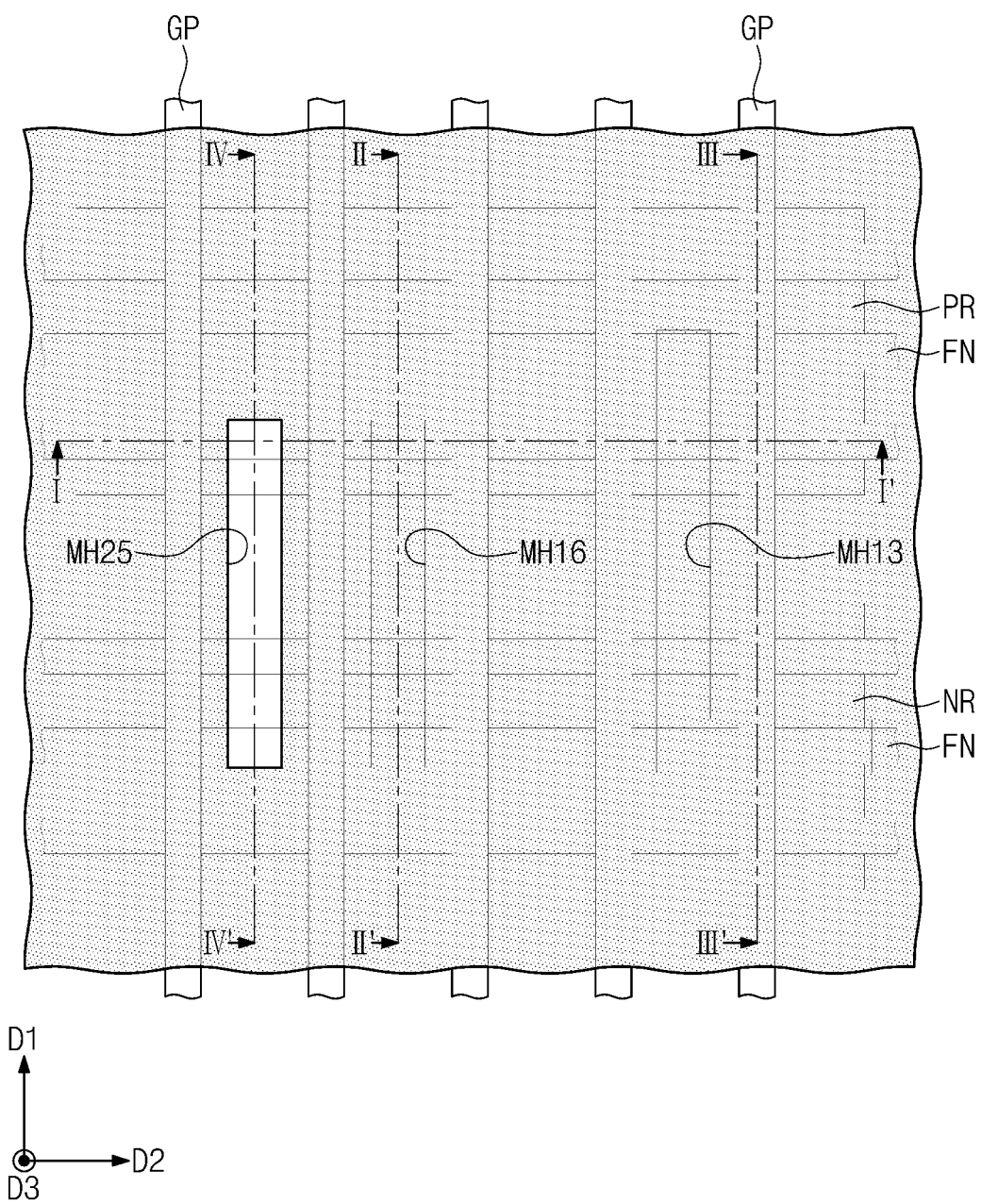
Figure 9B:
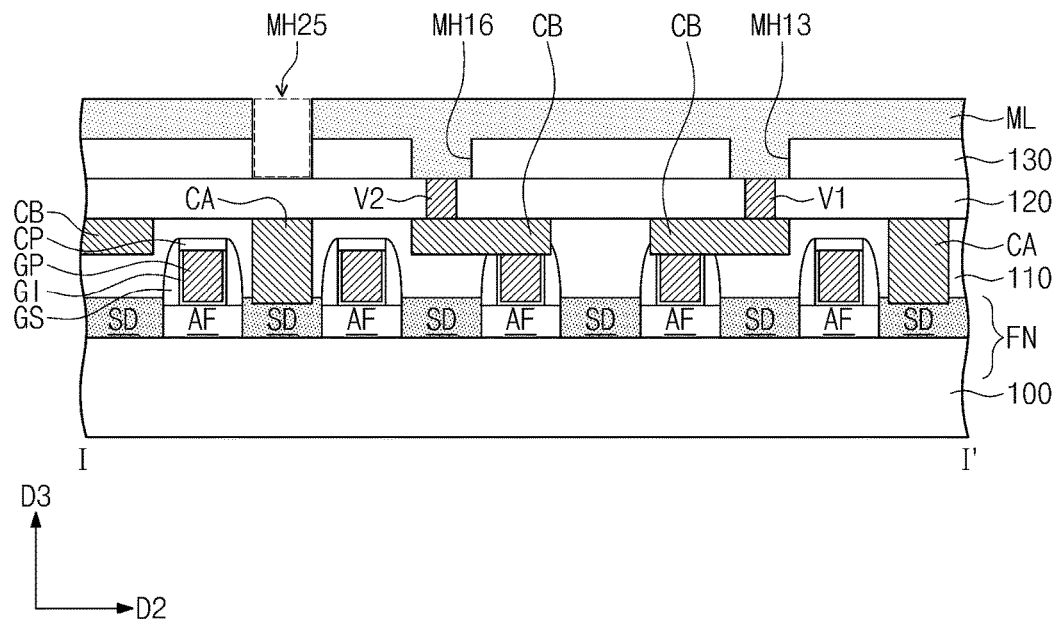
Figure 9C:
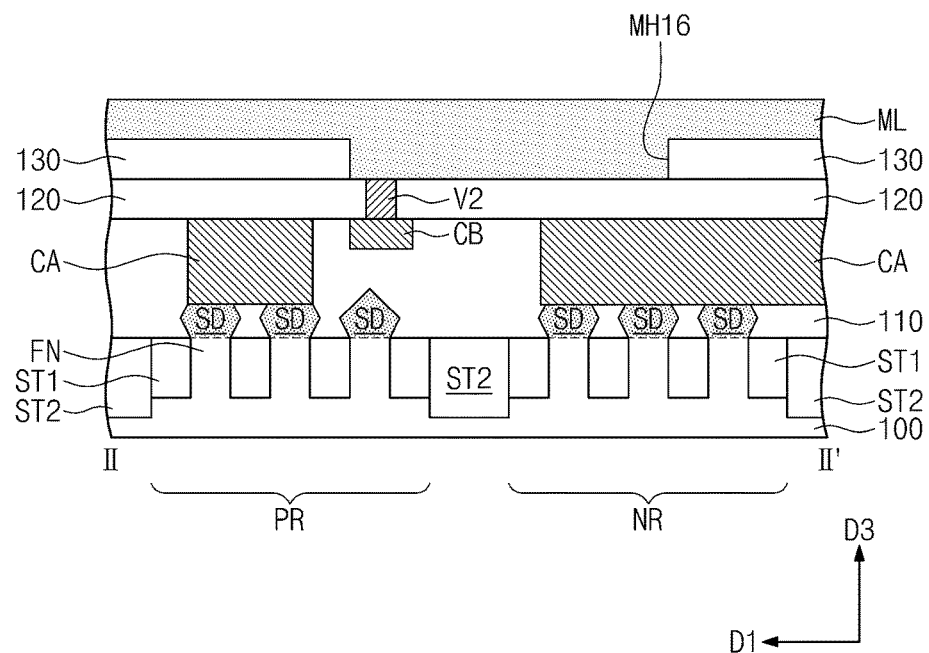
Figure 9D:
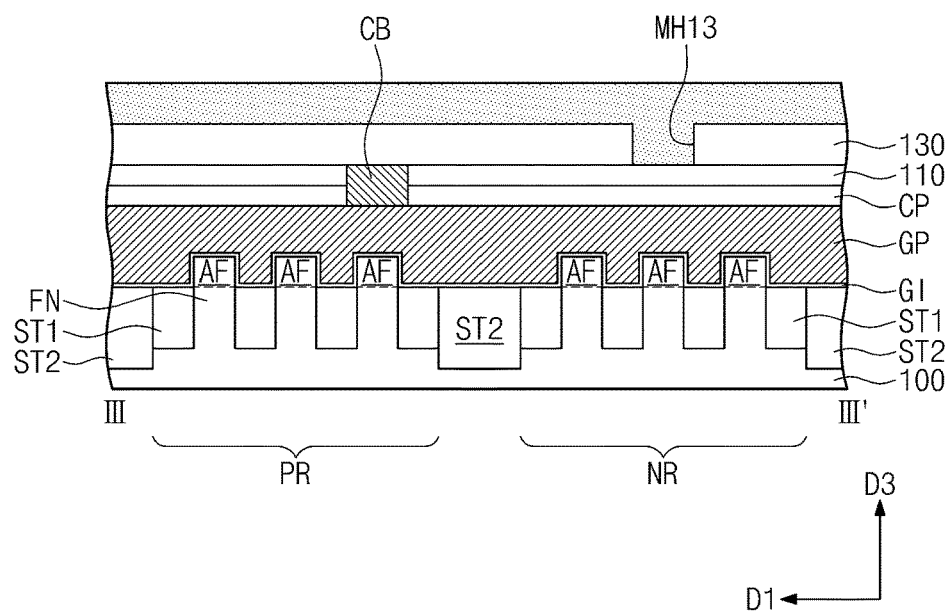
Figure 9E:
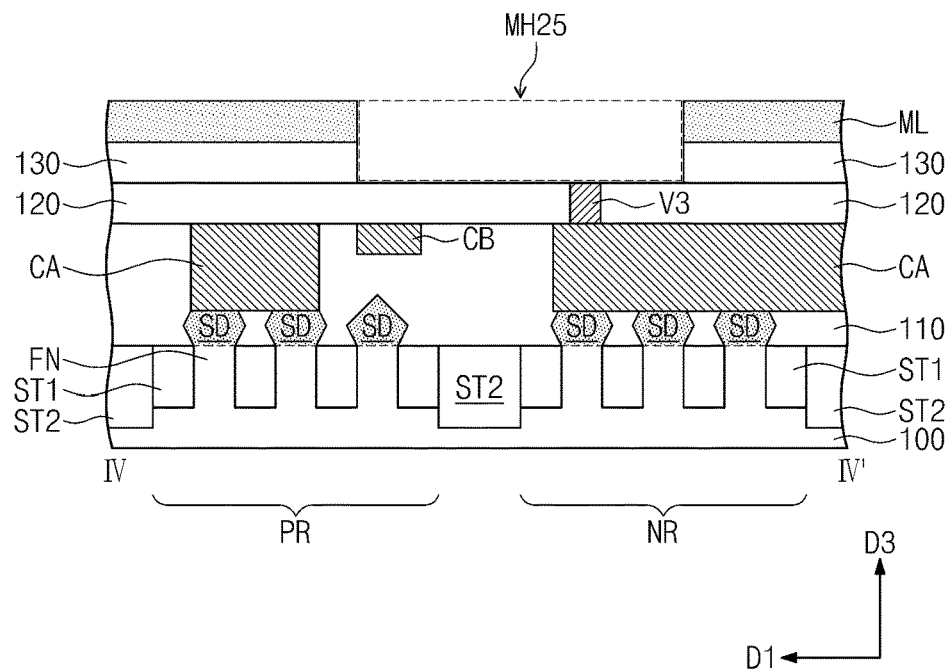
FIGS. 9E and 10E are cross-sectional views taken along lines IV-IV' of FIGS. 9A and 10A, respectively.
Figure 10A:
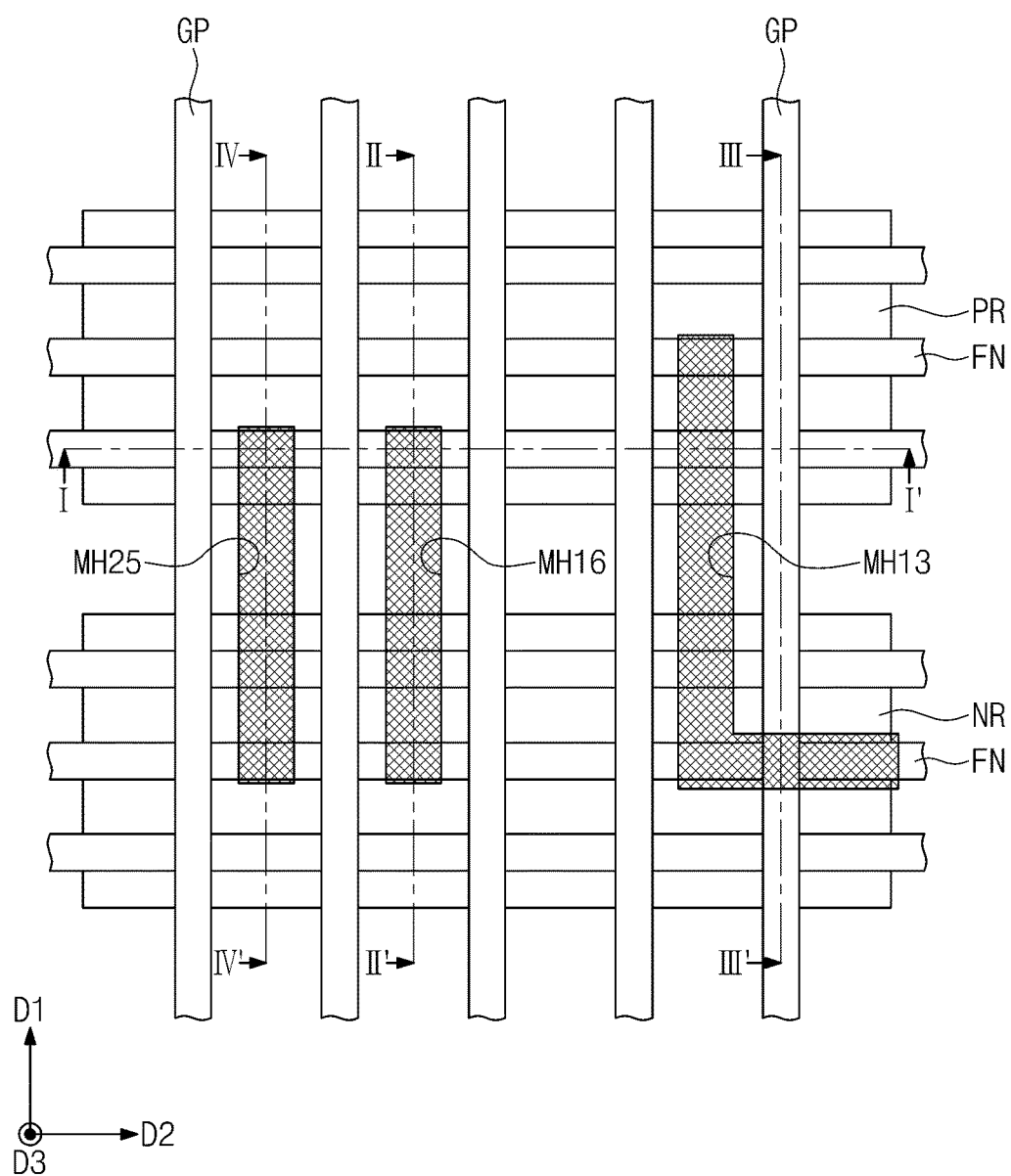
Figure 10B:
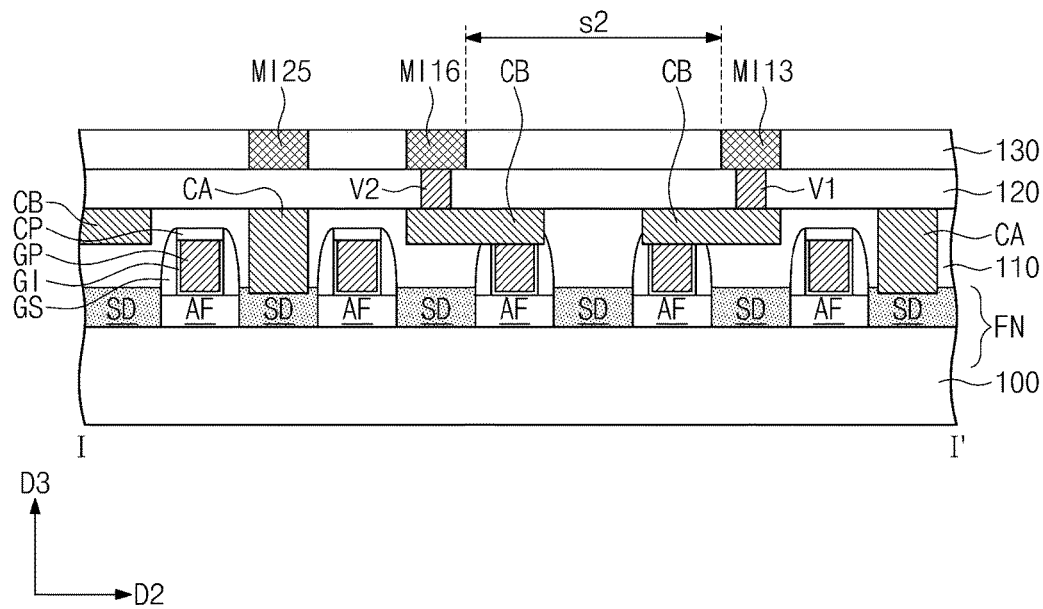
Figure 10C:
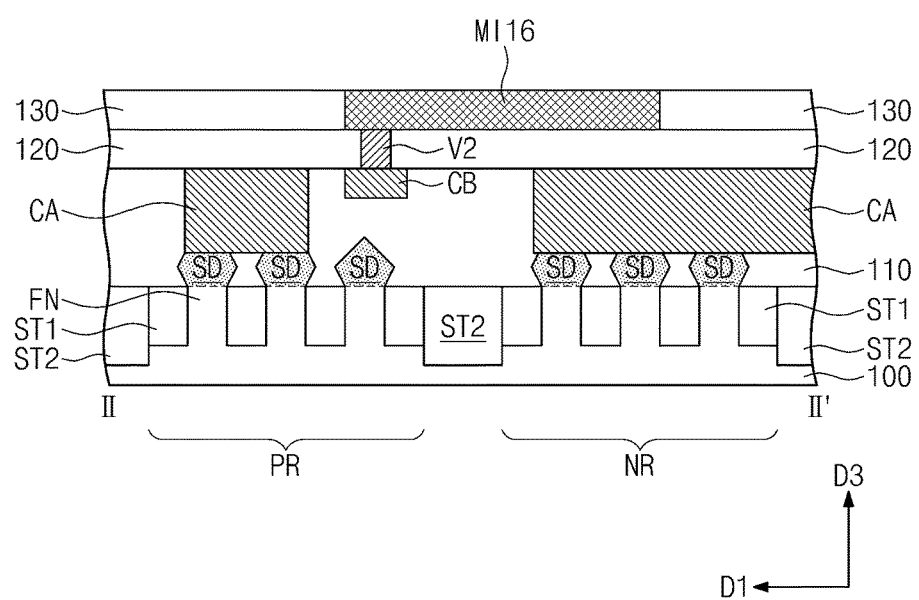
Figure 10D:
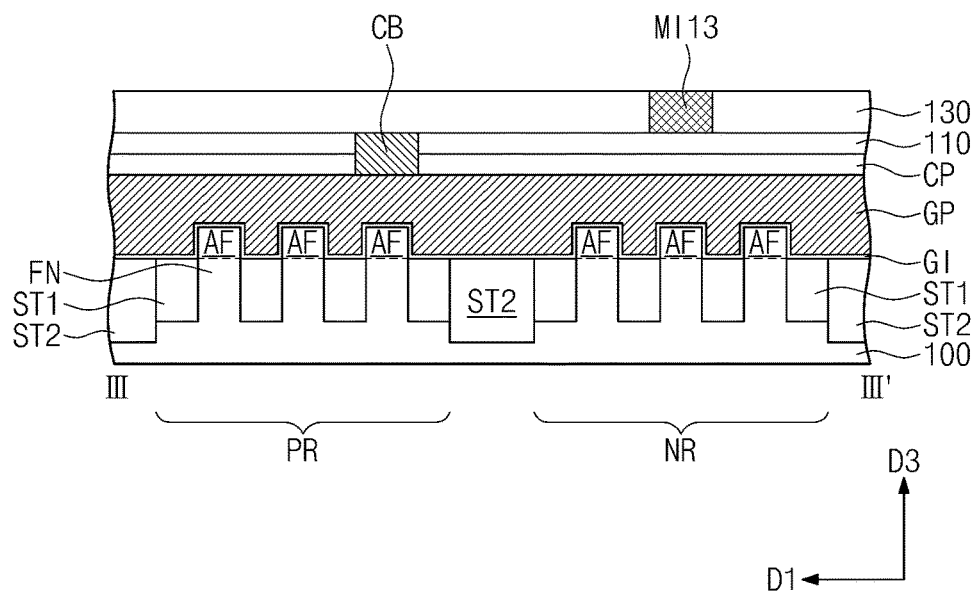
Figure 10E:
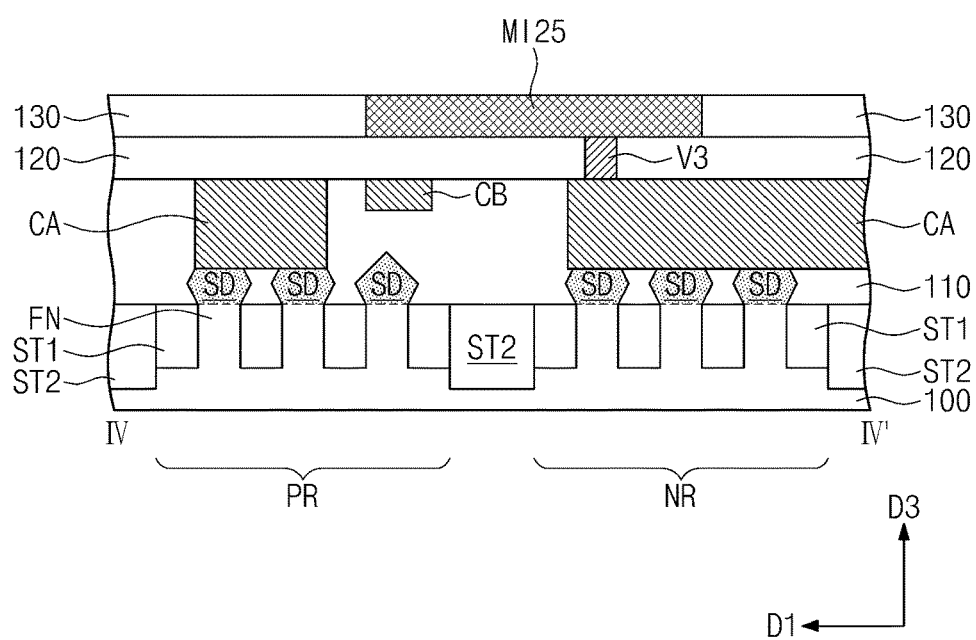

Below, a manufacturing method of a semiconductor device according to an exemplary embodiment is described. FIGS. 7A, 8A, 9A and 10A are plan views illustrating a manufacture process of a semiconductor device according to an exemplary embodiment. FIGS. 7B, 8B, 9B and 10B are cross-sectional views taken along lines I-I' of FIGS. 7A, 8A, 9A and 10A, respectively. FIGS. 7C, 8C, 9C and 10C are cross-sectional views taken along lines II-II' of FIGS. 7A, 8A, 9A and 10A, respectively. FIGS. 7D, 8D, 9D and 10D are cross-sectional views taken along III-III' of FIGS. 7A, 8A, 9A and 10A, respectively. FIGS. 9E and 10E are cross-sectional views taken along lines IV-IV' of FIGS. 9A and 10A, respectively.

Referring to FIGS. 7A to 7D, a substrate 100 may be provided. For example, the substrate 100 may be a silicon substrate, a germanium substrate, or a silicon-on-insulator (SOI) substrate. An active patterns FN may be formed in an upper portion of the substrate 100. First device isolation layers ST1 filling spaces between the active patterns FN may be formed. Second device isolation layers ST2 for defining a p-channel metal-oxide-semiconductor field effect transistor (PMOSFET) area PR and an n-channel metal oxide semiconductor field effect transistor (NMOSFET) area NR may be formed in the substrate 100. The first and second device isolation layers ST1 and ST2 may be formed by a shallow-trench isolation (STI) process. For example, the first and second device isolation layers ST1 and ST2 may include a silicon oxide layer.

Each of the first and second device isolation layers ST1 and ST2 may have a depth in a direction opposite to a third direction D3. The third direction D3 may be a direction perpendicular to a top surface of the substrate 100. For example, the depth of the first device isolation layers ST1 may be shallower than the depth of the second device isolation layers ST2. Here, a process of forming the first device isolation layers ST1 may be different from a process of forming the second device isolation layers ST2. In an exemplary embodiment, the first device isolation layers ST1 may be formed simultaneously with the second device isolation layers ST2, and a depth of the first device isolation layers ST1 may be substantially equal to a depth of the second device isolation layers ST2.

Gate electrodes GP intersecting the active patterns FN and extending in a first direction may be formed on the active patterns FN. The gate electrodes GP may be formed to be spaced apart from each other in a second direction. The gate insulation pattern GI may be formed under each of the gate electrodes GP, and the gate spacers GS may be formed on both sidewalls of each of the gate electrodes GP. Furthermore, a capping pattern CP covering a top surface of each of the gate electrodes GP may be formed. A first interlayer insulating layer 110 may be formed to cover the gate electrodes GP.

The gate electrodes GP may include at least one of a doped semiconductor, metal, or conductive metal nitride. The gate insulation pattern GI may include a silicon oxide layer and/or a silicon oxynitride layer and may include a high-k dielectric layer of which a dielectric constant is higher than a dielectric constant of a silicon oxide layer. Each of the capping pattern CP and the gate spacers GS may include at least one of a silicon oxide layer, a silicon nitride layer, or a silicon oxynitride layer. The first interlayer insulating layer 110 may include a silicon oxide layer or a silicon oxynitride layer.

Source/drain areas SD may be formed on the active pattern FN located at opposite sides (i.e., dual sides) of each of the gate electrodes GP. The source/drain areas SD may be p-type or n-type dopant regions.

The source/drain areas SD may include epitaxial patterns formed by a selective epitaxial growth (SEG) process. The source/drain areas SD may include a semiconductor element different from a semiconductor element of the substrate 100. For example, the source/drain areas SD may include a semiconductor element having a lattice constant greater than or smaller than a lattice constant of a semiconductor element of the substrate 100. The source/drain areas SD may include a semiconductor element different from a semiconductor element included in the substrate 100, thereby applying compressive stress or tensile stress to the channel areas AF between the source/drain areas SD. For example, when the substrate 100 is a silicon substrate, the source/drain areas SD may include embedded silicon-germanium (SiGe) or germanium. In this case, the source/drain areas SD may provide the compressive stress to the channel areas AF. In an exemplary embodiment, when the substrate 100 is a silicon substrate, the source/drain areas SD of NMOSFET area NR may include a silicon carbide (SiC). In this case, the tensile stress may be applied to the channel areas AF. As a result, mobility of carriers generated in the channel areas AF may be improved.

Source/drain contacts CA may be formed between the gate electrodes GP. The source/drain contacts CA may be in direct contact with the source/drain areas SD and may be electrically connected thereto. The source/drain contacts CA may be provided in the first interlayer insulating layer 110. At least one of the source/drain contacts CA may be connected to the source/drain areas SD arranged in the first direction D1 in parallel.

Gate contacts CB may be formed in an upper potion of the first interlayer insulating layer 110. Each of the gate contacts CB may pass through the capping pattern CP and may be directly connected to the gate electrode GP. Bottom surfaces of the gate contacts CB may be higher than bottom surfaces of the source/drain contacts CA. Furthermore, the bottom surfaces of the gate contacts CB may be higher than top surfaces of the source/drain areas SD.

Referring to FIGS. 8A to 8D, a second interlayer insulating layer 120 may be formed on the first interlayer insulating layer 110. Moreover, first and second vias V1 and V2 may be formed in the second interlayer insulating layer 120. The first and second vias V1 and V2 may be electrically connected to the gate contacts CB. A third interlayer insulating layer 130 may be formed on the second interlayer insulating layer 120.

Conductive line holes MH13 and MH16 which pass through the third interlayer insulating layer 130 may be formed by the first photolithography process using a first photomask. The first photomask may be manufactured using a first patterning group including the conductive pattern M13 and the dummy pattern M16 described with reference to FIGS. 4 to 6. Here, a distance between the conductive line holes MH13 and MH16 may be equal to or greater than the reference distance s2 which is set in consideration of a resolution of a photolithography process.

In detail, forming the conductive line holes MH13 and MH16 may include manufacturing the first photomask using the first patterning group, forming a first photolithography pattern on the third interlayer insulating layer 130, and etching the third interlayer insulating layer 130 using the first photolithography pattern as an etch mask to form the conductive line holes MH13 and MH16.

Referring to FIGS. 9A to 9E, a mask layer ML filling the conductive line holes MH13 and MH16 may be formed. A conductive line hole MH25 which passes through the mask layer ML and the third interlayer insulating layer 130 may be formed by performing the second photolithography process using a second photomask. The second photomask may be manufactured using a second patterning group including the conductive pattern M25 described with reference to FIGS. 4 to 6. In detail, the forming of the conductive line hole MH25 may include manufacturing the second photomask using the second patterning group, forming a second photolithography pattern on the mask layer ML using the second photomask, and etching the mask layer ML and the third interlayer insulating layer 130 using the second photolithography pattern as an etching mask to form the conductive line hole MH25.

Referring to FIGS. 10A to 10E, the mask layer ML may be removed. Moreover, a conductive material may fill the conductive lines holes MH25, MH16, and MH13 to form conductive lines MI25, MI16, and MI13 respectively corresponding to the dummy patterns M25 and M16 and the conductive pattern M13 which are illustrated in FIG. 6.

Based on a manufacturing method of a semiconductor device according to an exemplary embodiment, conductive patterns adjacent to a boundary between logic cells adjacent to each other may be formed by different photolithography processes from each other. On the other hand, the conductive patterns adjacent to a boundary between a dummy cell and a logic cell adjacent to each other may be formed by the same photolithography process and may be spaced apart from each other by a reference distance or more which is set in consideration of a resolution of a photolithography process. Based on such a manufacturing method, an additional swapping (i.e., rearrangement of conductive patterns) operation performed after insertion of a dummy cell in a layout design step may be omitted, thereby reducing a layout design time.

Figure 11:
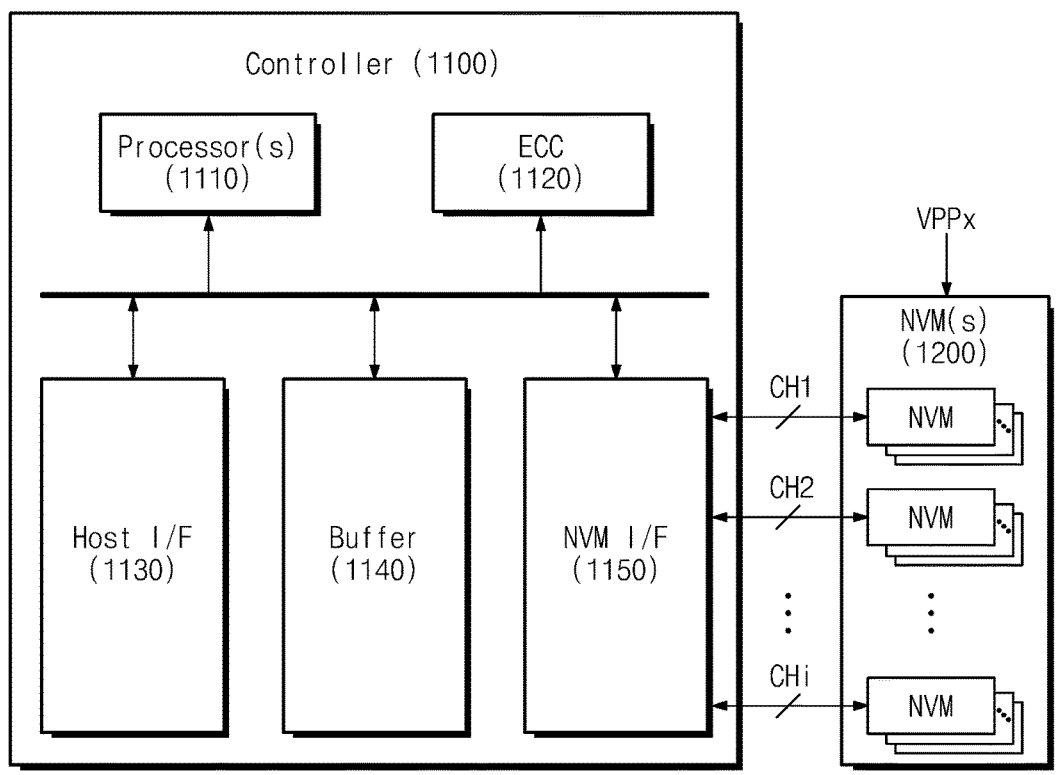
FIG. 11 is a block diagram exemplarily illustrating a SSD manufactured by a method for designing a layout of a semiconductor device, according to an exemplary embodiment.

FIG. 11 is a block diagram exemplarily illustrating a SSD manufactured by a method for designing a layout of a semiconductor device, according to an exemplary embodiment. Referring to FIG. 11, a SSD 1000 may include a controller 1100 and a plurality of nonvolatile memories 1200. The controller 1100 and the nonvolatile memories 1200 may include a semiconductor device manufactured according to an above-described layout design method.

The controller 1100 may be connected to the nonvolatile memories 1200 through a plurality of channels CH1 to Chi (i.e., i is an integer of 2 or more). The nonvolatile memories 1200 connected to the controller 1100 through the same channel may be provided in the form of a multi-stack chip. The nonvolatile memories 1200 may be implemented to optionally receive an external high-voltage Vppx. Moreover, the controller 1100 may include at least one processor 1110, an error correction circuit 1120, a host interface 1130, a buffer, and a nonvolatile memory interface 1150.

The host interface 1130 may provide an interface function for interfacing with an external device. For example, the host interface 1110 may be a NAND flash interface. Besides, the host interface 1110 may be implemented by various interfaces and may be implemented with a plurality of interfaces. The error correction circuit 1120 may calculate a value of an error correction code of data to be programmed in a writing operation, may correct data read in a reading operation based on the value of the error correction code, and may correct an error of data recovered from the nonvolatile memories 1200. Although not illustrated, a code memory which stores code data for operating the controller 1100 may be further included in the error correction circuit 1120. The code memory may be implemented with a nonvolatile memory. The buffer 1130 may temporarily store data for operating the controller 1100. The buffer 1130 may temporarily store data to be programmed to the nonvolatile memories 1200 or may temporarily store data which was read from the nonvolatile memories 1200. The nonvolatile memory interface 1150 may provide an interface function between the controller 1100 and the nonvolatile memories 1200.

Exemplary embodiments may reduce a layout design time, which increase according to insertion of a dummy cell during a layout design of a semiconductor device.

Those of ordinary skill in the art will recognize that various changes and modifications of the exemplary embodiments described herein can be made without departing from the scope and spirit of the inventive concept. Modifications of the inventive concept may be included within the scope of the following claims and equivalents.

What is claimed is:

1. A method of manufacturing a semiconductor device, the method comprising:
 configuring a layout pattern; and
 forming conductive lines corresponding to the layout pattern on a substrate, wherein configuring the layout pattern comprises:
  arranging pre-conductive patterns and post-conductive patterns for a first logic cell, a second logic cell, and a third logic cell;
  rearranging the pre-conductive patterns and the post-conductive patterns so that two conductive patterns that are adjacent to a boundary between two adjacent logic cells from among the first logic cell, the second logic cell, and the third logic cell are formed by different photolithography processes; and
  arranging conductive patterns for a dummy cell arranged between the second logic cell and the third logic cell,
 wherein a first conductive pattern, which is adjacent to the second logic cell, from among conductive patterns of the first logic cell is spaced a first reference distance apart from a second conductive pattern, which is adjacent to the first logic cell, from among conductive patterns of the second logic cell, and
 wherein a dummy pattern, which is adjacent to the third logic cell, from among conductive patterns of the dummy cell is spaced a second reference distance apart from a third conductive pattern, which is adjacent to the dummy cell, from among conductive patterns of the third logic cell, and
 wherein the second reference distance is greater than the first reference distance.

2. The method of claim 1, wherein the first reference distance and the second reference distance are set based on a resolution of a photolithography process for forming the pre-conductive patterns and the post-conductive patterns.

3. The method of claim 1, wherein the first conductive pattern and the second conductive pattern are formed by a patterning process using different photomasks, and
 wherein the dummy line and the third conductive pattern are formed by a patterning process using the same photomask.

4. The method of claim 3, wherein a fourth conductive pattern, which is adjacent to the dummy cell, from among conductive patterns of the second logic cell and the third conductive pattern is formed by a patterning process using different photomasks.

5. The method of claim 1, wherein at least two of the first conductive pattern, the second conductive pattern, the third conductive pattern, and the dummy pattern are arranged in a first direction perpendicular to a direction in which the first logic cell, the second logic cell, the third logic cell, and the dummy cell are arranged.

6. The method of claim 1, wherein the dummy cell is one from among a filler, a filling capacitor, and a spare cell.

* * * * *